United States Patent [19]
Butsch et al.

[11] Patent Number: 5,916,716
[45] Date of Patent: *Jun. 29, 1999

[54] EMULATION METHODOLOGY FOR CRITICAL DIMENSION CONTROL IN E-BEAM LITHOGRAPHY

[75] Inventors: Rainer Butsch, Fairport; Timothy R. Groves, Poughkeepsie; John G. Hartley, Fishkill, all of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/816,240

[22] Filed: Mar. 13, 1997

[51] Int. Cl.$^6$ ............................................. G03C 5/00
[52] U.S. Cl. ........................... 430/30; 430/296; 430/942
[58] Field of Search ............................. 430/30, 296, 942

[56] References Cited

U.S. PATENT DOCUMENTS 4,500,789  2/1985  Ban et al. ............................. 250/492.2
5,573,877  11/1996  Inoue et al. ............................. 430/30
5,597,670  1/1997  Aketagawa et al. ...................... 430/30
5,736,281  4/1998  Watson .................................... 430/30

*Primary Examiner*—Nam Nguyen
*Assistant Examiner*—Steven H. VerSteeg
*Attorney, Agent, or Firm*—Whitham, Curtis & Whitham; H. Daniel Schnurmann

[57] ABSTRACT

Across chip line width variations and other repetitive deviations from the design pattern desired in E-Beam lithography are compensated for by examining each of the regions (i.e., frames, stripes, etc.) of a patterned substrate, determining the amount of deviation for each region, and using the determined regional deviation as a local bias when patterning subsequent substrates. Thus, the E-Beam lithography tool will utilize both global and local biases in order to produce new patterned substrates which lack the deviations found when local bias was not applied. In this way, the root cause of the deviation does not need to be determined. The local bias can be applied directly by modifying the E-Beam lithography system tool commands to provide for patterning wider or thinner lines or to provide for greater or lesser exposure time. Alternatively, the local bias can be applied by varying the emission current of the electron gun for different regions of the substrate.

15 Claims, 4 Drawing Sheets

EMULATION METHODOLOGY FOR CRITICAL DIMENSION CONTROL IN E-BEAM LITHOGRAPHY

BACKGROUND OF THE INVENTION

1. Field of the Invention

The present invention generally relates to electron beam (E-beam) lithography and particularly to a methodology which compensates for repeatable across chip and across wafer line width variations in the E-beam patterned substrates (e.g., mask or wafer) from both known and unknown sources.

2. Background Description

Electron beam lithography can be viewed as a process of electronically forming precise copies of a pattern design in a resist covered substrate. It is imperative in this process that the shapes making up the pattern design be accurately placed relative to each other during the resist patterning. Equally important is the uniformity of the scaling of the shapes generated in the resist from the pattern design. In E-beam lithography, shapes imaged in the resist may exhibit systematic deviations from the designed size as a function of location on the substrate. For example, a systematic change of beam current during patterning caused by column charging can result in systematic deviations from the designed size. In addition, there may be process induced size variations that result in systematic deviations. One example of this sort of problem is the case where the image size exhibits a bowing character across a substrate. For example, the images may be 5% smaller than the nominal design at the left and right edges of the substrate and 5% larger in the center.

Often, the root cause or causes of the image size variation problem will not be known and will not be easily identified. In applications where dimensions are critical, such as integrated circuit applications having micron and submicron line widths, patterning of the substrates may need to be halted until the root causes are identified and corrected. This can lead to serious economic cost increases. What is needed is a methodology and apparatus which allows compensating for pattern deviations which have a repeatable component present, thereby allowing production to continue with or without having full knowledge of the problem's source.

SUMMARY OF THE INVENTION

It is therefore an object of the present invention to provide a methodology which works in conjunction with a lithography system to compensate for repeating pattern deviations, such as across chip line width variations, and which does not require knowledge of the root source of the pattern deviation.

According to the invention, one or more parts are processed normally with the photo resist being exposed to a design pattern which includes factors for any known global process biases. The horizontal and vertical deviations from the design pattern are then determined for a plurality of regions on the substrate, wherein the regions can constitute different fields, sub-fields, frames, or stripes. A table is then constructed which includes the average horizontal and vertical image deviations for each region measured. For subsequent E-beam patterning operations, these deviations are used as a local bias such that each region of the substrate being patterned has both global and local biases and the resulting substrate lacks the repetitive pattern deviations which are produced when local biasing is not used. Thus, the invention provides a mechanism for compensating for any process variations or tool characteristics that give rise to substrate pattern deviations without requiring identifying and correcting these process or tool characteristics.

The local bias can be applied in a number of different ways. For example, the tool commands used to drive the components of the E-Beam lithography system can be adjusted or modified to provide for writing wider or narrower lines, etc. In addition, the tool commands may be modified to provide for greater or lesser E-Beam exposure to the substrate, thereby altering the width of the lines. Alternatively, current density of the beam leaving the electron gun can be modified on a field-by-field or stripe-by-stripe basis to provide a local bias. This can be accomplished by varying the voltage on the grid positioned in front of the electron gun as a function of the region of the substrate being patterned. This alternative approach has the advantage that it does not require revising the E-beam tool commands. The end result is uniform line width everywhere equal to the target value.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

This invention works with any lithography system in which the pattern to be exposed may be subdivided into regions with definite and repeatable boundaries. In a step and repeat system these areas are commonly referred to as "fields" or "partitions". In systems which utilize a continuously moving stage, these regions are sometimes referred to as "stripes" or "frames".

Figure 1:
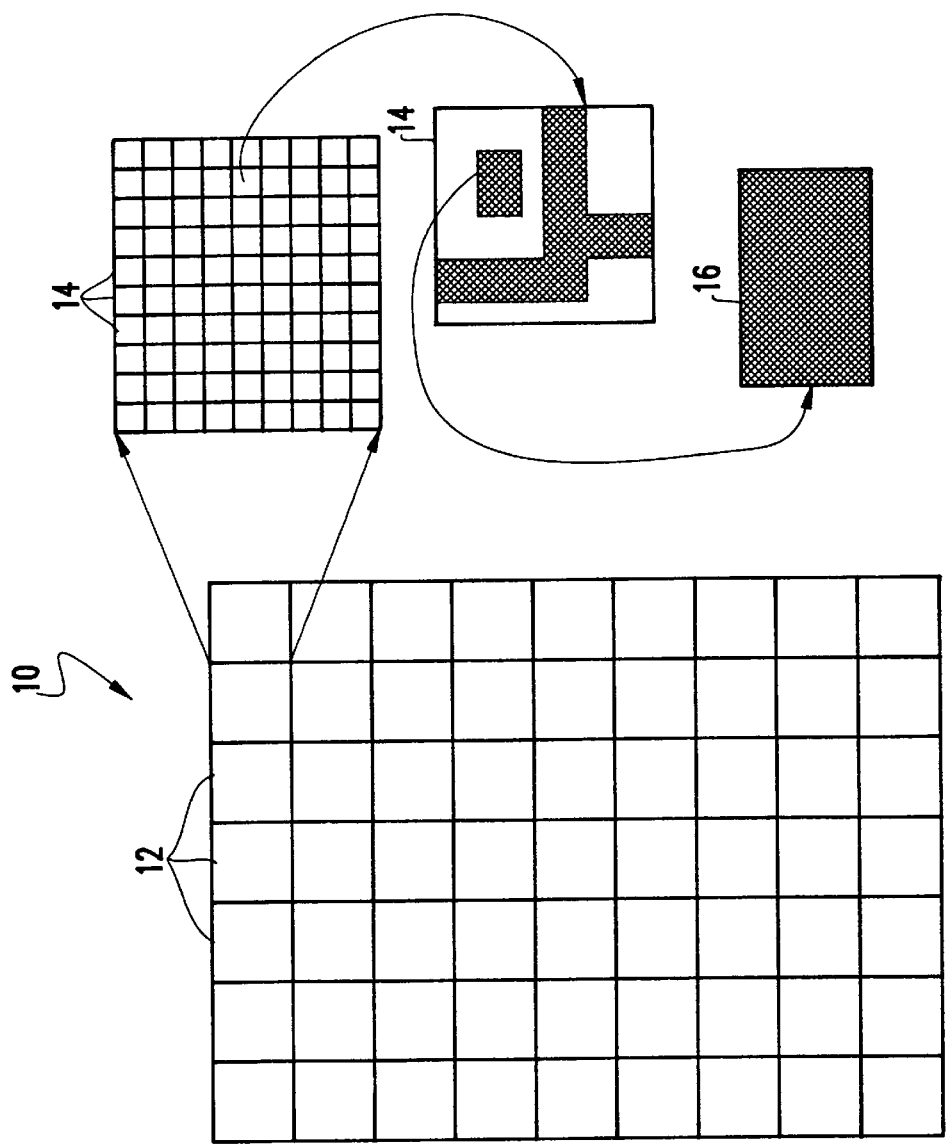
FIG. 1 is a schematic diagram illustrating the components of design pattern used in a step and repeat lithography system as an example, the method also being applicable to other architectures.

FIG. 1 illustrates the components of a design pattern used in a step and repeat lithography system. The design pattern is comprised of a skeleton 10 which is built up from a plurality of fields 12. Each field 12 could be an individual chip or distinct region of a substrate. Each field 12 is built up from a plurality of sub-fields 14. Patterns are created in the fields 12 from several discrete patterns in the sub-fields 14. The patterns in the subfields 14 can be defined by "rectangles" or "blocks" 16 which are built up from individual spots. Lithography systems that use a continuously moving stage differ in that patterning is not achieved from incrementally moving from field to field; rather, the patterns are continuously formed on a substrate with discrete areas of the substrate being defined as "stripes" or "frames". Both step and repeat lithography systems and systems with continuously moving stages are well known to those skilled in the art, and this invention will have application in both types of systems.

Various steps in the processing of the exposed images may uniformly shrink or enlarge the design images created by exposing the resist with the electron beam in the lithography system. For example, the development step removes the part of the resist layer that has been exposed in the case of a positive tone resist, or the part that has not been exposed in the case of a negative tone resist. An etching or plating system (e.g., sputter deposition, evaporation or electroplating) is used to transfer developed images onto underlying layers. These process steps (i.e., developing, etching or plating, etc.) frequently affect the final image size. The difference or "delta" in image size between the design shapes and the patterned images which are ultimately produced is often referred to as the "bias" or "etch". It is current practice to treat this phenomena as a constant global offset or "global bias" to the image size. During the process of converting the "pattern design" into tool control commands, the individual shapes are uniformly reduced or enlarged by an amount equal to the global bias to compensate for the effects of processing (i.e., developing, etching or plating, etc.). For example, if the imaged photo resist enlarges 0.5 $\mu$m during development, and a subsequent reactive ion etch (RIE) enlarges the line another 0.2 $\mu$m from the desired pattern, the tool commands for the E-Beam lithography system are modified to image lines that are 0.7 $\mu$m thinner than the desired pattern, such that upon completing process steps of development and etching, the substrate has patterned lines having a width equivalent to the desired pattern.

While using a global bias in the tool commands for an E-Beam lithography system helps compensate for process variations that result from the choice of resist, choice of developer, plating material, type of etching, and the like, variations between the patterned image and the desired pattern still may be present in E-beam lithography system. Often, the root source of these variations is not known. They could be a result of periodic column charging, variations in the speed of movement of the table holding the substrate, or from other process parameters. One example of this type of repetitive variation would be a bowing across a substrate where the images are 5% smaller than the nominal design at the left and right edges and 5% larger in the center. This invention provides a methodology for compensating for these types of variations in E-Beam lithography systems which employs a local bias, in addition to any global bias, for different regions on the substrate. The local bias is determined from differences between the nominal pattern design and an actual pattern in a substrate for different regions in a substrate. Subsequent parts are patterned using the local bias, and any global bias, such that the patterned parts more accurately reflect the desired pattern.

Figure 2:
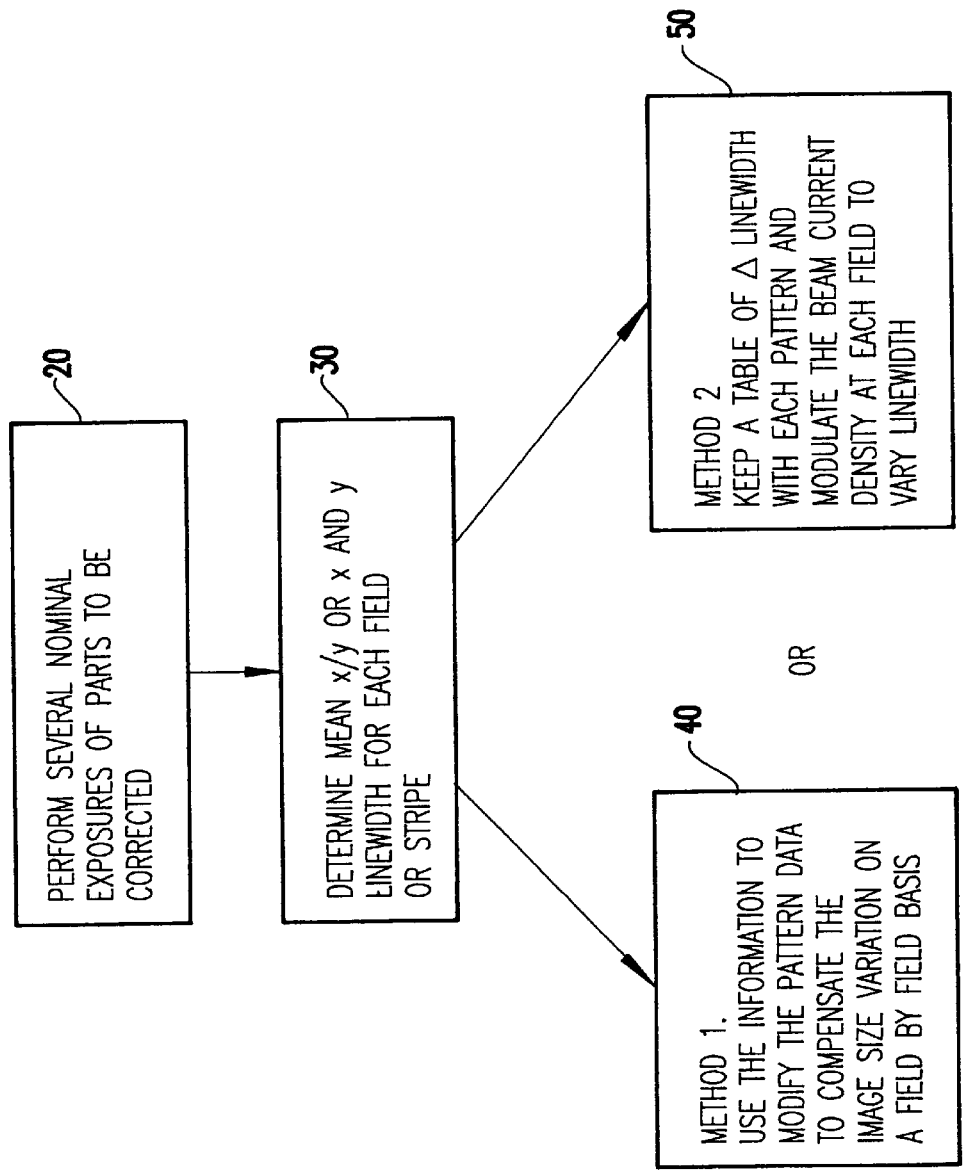
FIG. 2 is a flow diagram illustrating the correction process.

FIG. 2 shows a schematic of the methodology of this invention. In step 20, parts are patterned using the E-Beam lithography system. Patterning is accomplished in the normal manner wherein tool commands which specify the location, size, exposure parameters (energy and time of exposure), etc., and which factor in a global bias, control the components of the E-beam lithography system to produce a desired pattern in a substrate. Several parts can be patterned in step 20. In step 30, differences between the desired pattern and the actual pattern formed in the part(s) are assessed on a region-by-region basis. This can be accomplished using a precision line width metrology tool or other devices. Specifically, for each "frame" or "stripe" or other region of the part, the actual line width in the part created using the E-Beam lithography system is compared to the line width specified by the desired pattern (factoring in any global bias). An average line width variation in the "x" dimension and "y" dimension can be determined for each region and stored in a table. That is, the difference between the actual line width and the desired line width is determined in both the "x" and "y" dimensions for each region. In some cases, an average of both the "x" and "y" variations (i.e., (X+Y)/2) is determined for reach region and stored in a table. Patterning several parts according to normal E-Beam lithography systems (step 20) may allow a more accurate average deviation to be determined (step 30) for each region, since several substrates will be have been examined and considered.

In some E-Beam lithography systems, it is possible to apply an anisotropic bias, which is a bias that is specific for either horizontal deviations or vertical deviations. These systems allow for independent adjustments for horizontal and vertical deviations. With these systems, it is ideal to create a table that includes the average "x" and average "y" deviations for each region. As reflected by process step 40, the average "x" and average "y" deviations would then be used to modify the tool commands for the E-Beam lithography system to compensate for the image size variation in each region. That is, a local bias would be known for each region from step 30 (the local bias being the average "x" and "y" deviation for that region), and this local bias would be used in step 40 to adjust the tool commands of the E-Beam lithography system on a field-by- field or stripe-by-stripe or "region-by-region" basis. After this local bias is applied in the tool commands, subsequent parts are patterned using the E-Beam lithography system as before, except that when system advances from frame-to-frame or stripe to stripe, an "x" and "y" local bias is considered for that frame or stripe. Some lithography systems only support isotropic biasing. That is, the bias is applied equally in both the horizontal and vertical dimensions. In these cases, it is preferred to average the horizontal and vertical biases together which are determined for each region, and to create a table which includes a local isotropic bias for each field or stripe. As before, subsequent parts will be patterned with the E-Beam lithography system with the tool commands specifying a unique local bias for each region as the E-beam moves from region to region.

Figure 3:
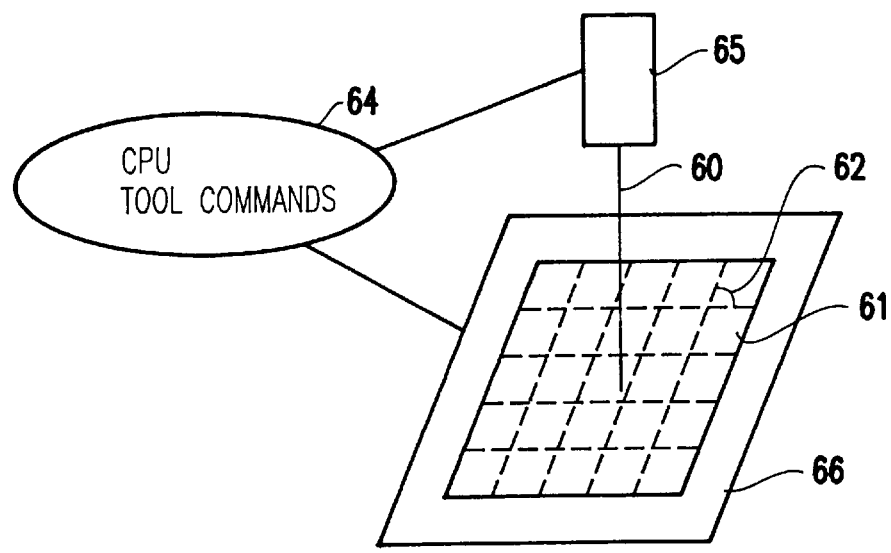
FIG. 3 is a schematic diagram illustrating an E-Beam lithography system where the tool commands are modified to include a local bias for each of a plurality of regions.

With reference to FIG. 3, it can be seen that the tool commands used to control the E-Beam lithography system will be modified such that as the E-Beam 60 moves between regions on the substrate 61 indicated by dashed lines 62, different "x" and "y" or "x/y" combined biases will be applied. The tool commands are generated from a computer 64 which interfaces with the electron gun 65 and x–y stage 66, and modifications can be input with a keyboard or other suitable interface. In operation, for example, if an across chip line width variation is determined in step 30 where the lines on the left and right edge regions are 5% smaller than desired, and the lines in the center region are 5% larger than desired, the tool commands will be altered with a local bias in each region in step 40 such that the tool commands specify patterning a 5% larger line in the left hand right edge regions and 5% smaller line in the center region.

It should be understood the process defined by steps 20, 30 and 40 contemplates determining and then applying a local bias for each of a plurality of regions being patterned in an E-beam lithography system. This local bias would be used in addition to any and all global process biases in adjusting the tool control commands. Hence, as the E-beam lithography system moves from field to field or stripe to stripe, the tool commands for each field or stripe are varied according to a local bias to compensate for the deviations determined in step 30. While the preferred embodiment contemplates using an average deviation for each field as the local bias, other factors might be considered when deciding on a suitable local bias with the only requirement being that the local bias is selected to compensate for the deviations which occur in the various fields or stripes of the part being patterned by E-beam lithography. The advantage of the methodology shown in steps 20, 30, and 40 is that it allows compensating for variations between patterned lines and a desired pattern without knowing the root source of the variation.

A disadvantage of the methodology shown in steps 20, 30, and 40 is that it requires modifying the tool pattern commands for the E-Beam lithography system. For example, the tool commands must be revised for each region to specify larger or smaller line width dimensions. The tool commands may be modified prior to writing which has the undesired effect of creating multiple copies of otherwise identical fields when nominally identical fields are to be exposed. When the tool commands are revised in the E-Beam tool's data path, this problem may be avoided as only a single copy of the pattern data needs to be carried, along with a table of corrections for each field.

FIG. 2 also shows an alternative to step 40 which involves modulating the shape exposure dose to affect the image size. This step 50 is only capable of being applied on an isotropic basis. In E-Beam lithography, image size varies with exposure dose over a limited range. The exposure dose is the product of the current density and exposure time. Dose modulation can be accomplished by changing either the current density or the exposure time. The exposure time can be modified (e.g., longer or shorter exposures for each of a plurality of regions) to apply a local bias in each of the regions; however, this would require modifying the tool commands as proposed in step 40. In contrast, step 50 proposes modifying the current density on a region by region basis.

Figure 4:
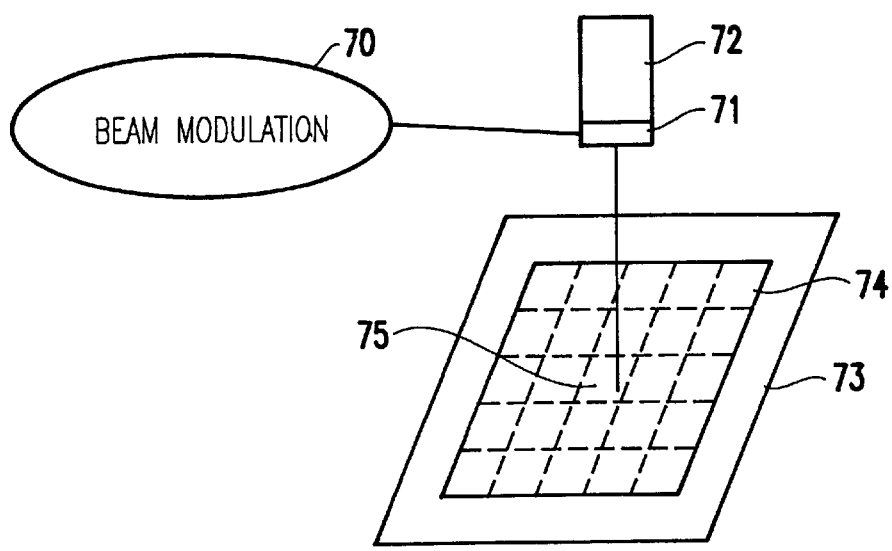
FIG. 4 is a schematic diagram illustrating an E-Beam lithography system where a local bias is applied by modifying the current density for each of a plurality of regions via beam modulation or similar techniques.

FIG. 4 best shows the alternative mode of operation of this invention, wherein controls for beam modulation 70 are directed to modulator 71 of the electron source 72. The amount of current leaving the electron gun (source 72) is controlled by the voltage applied to a bias grid (modulator 71) and is linear over the normal operating range of the gun. The nominal size of the beam image produced at the target plane 73 is fixed by the electron optic configuration of the column and the tool control commands. It is approximately independent of the emission current. The current density, and therefore the dose, may be modulated by changing the electron gun bias grid voltage. This variation in dose delivered to the resist results in images that are slightly over or under exposed. It is this variation in dose delivered to resist that is responsible for the controlled variation in line width at the target 74.

To exploit this property, the tool control computer consults the table of bias values prepared from the measurements made in step 30 prior to the exposure of each region and electronically transfers the mean image size correction needed for the region to the column control unit. At the column control unit, the information is converted to a change in the operating set point of the bias grid voltage. In order to determine the scale factor between image size delta and grid voltage, a separate calibration step must be performed. An approximate scaling factor may be readily estimated through either experimental or theoretical means. For example, with reference to FIG. 5, a series of constant size images 80 are exposed in a photo resist while varying the electron gun bias grid voltage. Variations in the grid voltage result in altered emission current leaving the gun. However, changes in current density also result in changes to the beam focus. Hence, for each grid voltage, a through focus series is exposed as well. This is accomplished by adjusting the focus coil to several different positions at each grid voltage. Because the change in current density may require the beam to be refocused for optimum edge slope, the focus series provides the information on the amount of refocusing necessary.

Figure 5:
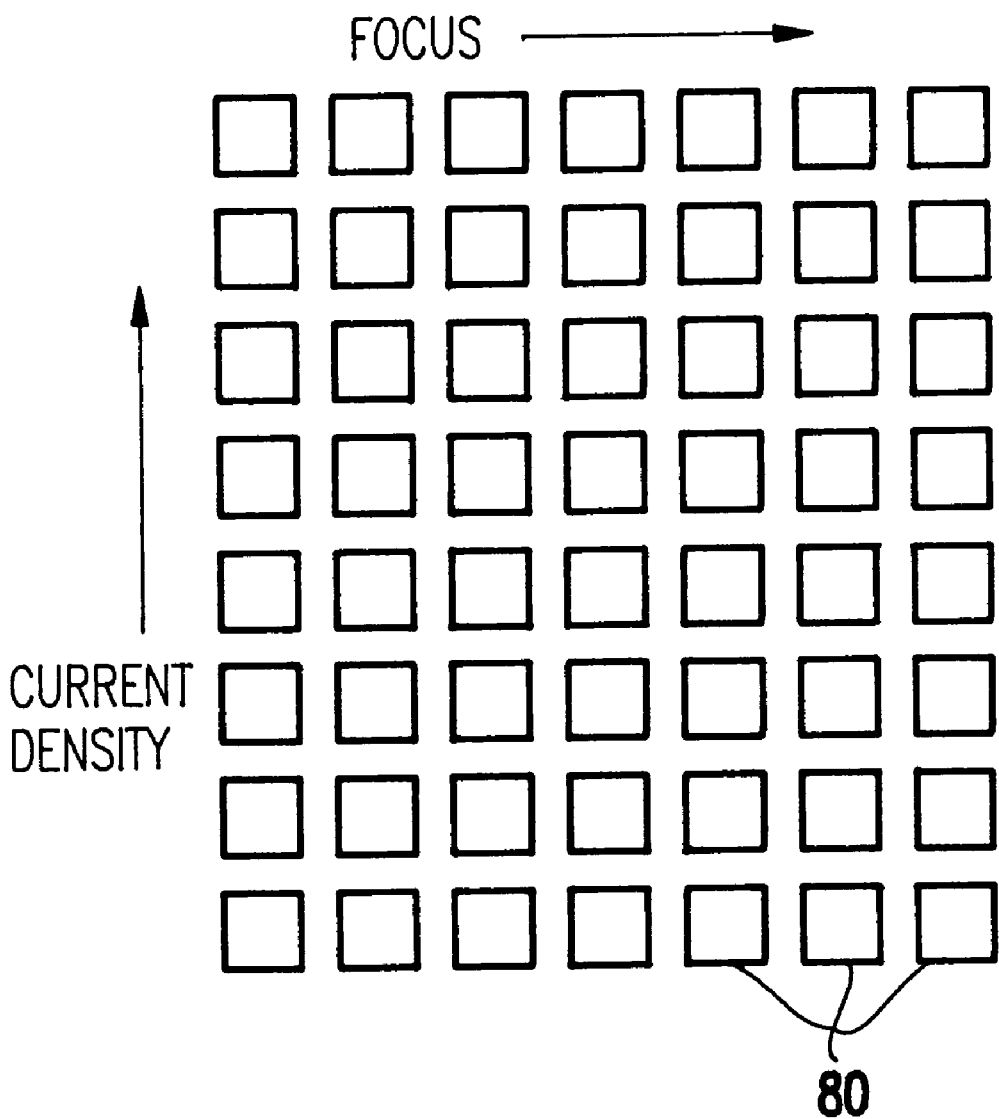
FIG. 5 is a graph of current density versus focus which is used for identifying the focus correction required for various current density changes used in an alternative mechanism for applying a local bias.

In operation, after performing a matrix exposure as shown in FIG. 5, the optimum focus for each setting of current density is determined. After performing process steps 20 and 30 shown in FIG. 2, the line width variation for each of a plurality of regions is known. A look up table will then be constructed which includes for each region the line width variation, the current density required to achieve the line width variation, and the optimum focus for the current density. With reference back to FIG. 4, when a region 75 is exposed, the lithography tool consults a line width correction table (determined from steps 20 and 30), and a look up table is examined so that appropriate changes to the current density and focus are made by the modulator 71 under computer control 70.

The method according to the invention is usable for direct write applications, including making masks with corrections derived from either the mask or the final wafer. The substrate can be a wafer, an X-ray mask or a glass mask of any size.

While the invention has been described in terms of a single preferred embodiment, those skilled in the art will recognize that the invention can be practiced with modification within the spirit and scope of the appended claims.

Having thus described our invention, what we claim as new and desire to secure by Letters patent is as follows:

1. A method for controlling line width variations in electron beam lithography, comprising the steps of:

patterning a test substrate in a plurality of regions using tool commands selected for a desired design pattern for each region, said patterning step producing a test pattern on said test substrate;

determining horizontal and vertical line width variations of said test pattern for each region;

comparing said horizontal and vertical line width variations and said desired design pattern on a region-by-region basis in said plurality of regions on said test substrate in order to determine a local bias for each region, said local bias being a deviation between all desired design patterns and line width variations in each region of said plurality of regions; and adjusting patterning processes based on said local bias in each region determined in said comparing step to include said local bias for each of said regions such that subsequent substrate patterns are adjusted in a manner which compensates for said deviations determined in said comparing step in each region of said plurality of regions.

2. The method of claim 1 wherein said patterning step includes a global bias based on patterning processes for said desired design pattern, and wherein said adjusting step includes said global bias such that each of said plurality of regions of said subsequent substrates is patterned considering both said global bias and said local bias.

3. The method of claim 1 further comprising averaging said horizontal and vertical line width deviations for each measured region and wherein said adjusting step uses said average deviation as said local bias for each of said plurality of regions in order to adjust said patterning processes to compensate for image size variation in each region.

4. The method of claim 1 wherein said assessing step provides both an average x deviation and an average y deviation for each of said plurality of regions, and wherein said adjusting step uses both said average x and average y deviation as a local bias for each of said plurality of regions.

5. The method of claim 1 wherein said adjusting step includes as said local bias the step of modifying said tool commands selected for said desired design pattern in a manner which alters line width dimensions in selected regions of said plurality of regions.

6. The method of claim 5 wherein said modifying step enlarges line width dimensions in selected regions.

7. The method of claim 5 wherein said modifying step reduces line width dimensions in selected regions.

8. The method of claim 1 wherein said adjusting step includes as said local bias the step of modifying said tool commands selected for said desired design pattern in a manner which alters exposure times for selected regions of said plurality of regions.

9. The method of claim 8 wherein said modifying step increases exposure times in selected regions.

10. The method of claim 8 wherein said modifying step decreases exposure times in selected regions.

11. The method of claim 1 wherein said adjusting step includes as said local bias the step of modifying current density for selected regions of said plurality of regions.

12. The method of claim 11 wherein said step of modifying current density includes the step of varying an electron grid bias voltage.

13. The method of claim 12 further comprising the step of adjusting a beam focus based on an electron grid bias voltage.

14. The method of claim 1 wherein said step of determining is accomplished using a metrology tool.

15. The method of claim 1 wherein said subsequent substrate is a wafer, X-ray mask or glass mask.

* * * * *